(12) United States Patent
Rivas et al.

(10) Patent No.: US 11,828,932 B2
(45) Date of Patent: Nov. 28, 2023

(54) LENS ASSEMBLIES WITH INTEGRATED HEATER ELEMENTS

(71) Applicant: ZF Active Safety and Electronics US LLC, Livonia, MI (US)

(72) Inventors: Anthony Rivas, Royal Oak, MI (US); Thomas E. Blake, III, Novi, MI (US); Jeffrey Dudek, Farmington Hills, MI (US); Robert Newton, Chesterfield, MI (US)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 769 days.

(21) Appl. No.: 16/698,173

(22) Filed: Nov. 27, 2019

(65) Prior Publication Data

US 2021/0116704 A1   Apr. 22, 2021

Related U.S. Application Data

(60) Provisional application No. 62/923,230, filed on Oct. 18, 2019.

(51) Int. Cl.
| | |
|---|---|
| *G02B 27/00* | (2006.01) |
| *H05K 1/18* | (2006.01) |
| *G02B 7/02* | (2021.01) |
| *H01R 12/82* | (2011.01) |
| *H01R 12/58* | (2011.01) |
| *B60S 1/02* | (2006.01) |
| *B60R 11/04* | (2006.01) |

(Continued)

(52) U.S. Cl.
CPC ......... *G02B 27/0006* (2013.01); *G02B 7/028* (2013.01); *H05K 1/18* (2013.01); *B60R 11/04* (2013.01); *B60R 2011/004* (2013.01); *B60S 1/023* (2013.01); *B60S 1/56* (2013.01); *H01R 12/58* (2013.01); *H01R 12/714* (2013.01); *H01R 12/82* (2013.01); *H05K 2201/10121* (2013.01)

(58) Field of Classification Search
CPC ...... G02B 27/00; G02B 27/0006; G02B 7/02; G02B 1/021; G02B 7/026; G02B 7/028; G02B 7/008; H04N 5/2252; H04N 5/22521; H04N 5/2254; H04N 5/2257; B60R 11/04; B60R 1/00; B60R 2011/004; B60S 1/023; B60S 1/56; H01R 12/58; H01R 12/714; H01R 12/82; H05K 1/18; H05K 2201/10121
USPC .......................... 359/511–513, 507, 694, 820
See application file for complete search history.

(56) References Cited

U.S. PATENT DOCUMENTS

| | | | |
|---|---|---|---|
| 2012/0120511 A1* | 5/2012 | Ku | H02K 41/02 359/824 |
| 2019/0033690 A1* | 1/2019 | Choi | H05B 3/84 |

(Continued)

*Primary Examiner* — Jie Lei
(74) *Attorney, Agent, or Firm* — CANTOR COLBURN LLP

(57) ABSTRACT

A lens assembly includes a lens, a lens barrel, and a heater element. The lens has an inner surface and an outer surface. The lens barrel supports the lens and defines an optical axis, the lens arranged along the optical axis such that the inner surface of the lens is within the lens barrel and the outer surface of the lens is outside the lens barrel. The heater element is in intimate mechanical communication with the inner surface of the lens and has a heater element electrical lead extending radially therefrom to provide power to the heater element. Lens heating methods are also described.

16 Claims, 5 Drawing Sheets

(51) Int. Cl.
*B60S 1/56* (2006.01)
*B60R 11/00* (2006.01)
*H01R 12/71* (2011.01)

(56) References Cited

U.S. PATENT DOCUMENTS

2021/0294066 A1* 9/2021 Hirata ................. G02B 27/0006
2022/0050361 A1* 2/2022 Rivas ........................ B60R 1/00

* cited by examiner

LENS ASSEMBLIES WITH INTEGRATED HEATER ELEMENTS

CROSS-REFERENCE TO RELATED APPLICATIONS

This application claims priority to and the benefits of U.S. Provision Application No. 62/923,230, filed Oct. 18, 2019, the contents of which is incorporated herein by reference in its entirety.

INTRODUCTION

The subject disclosure relates to automotive sensors.

A vehicle (e.g., automobile, truck, construction equipment, farm equipment, automated factory equipment) may include a number of sensors to provide information about the vehicle and the environment inside and outside the vehicle. For example, a camera may provide information about objects around the vehicle and within a field a view of the camera provided by the lens. Cameras mounted external to the vehicle, e.g., on side mirrors, front grills, etc., can be prone to ice build-up. The ice build-up can impair (or block entirely) the camera field of view and limit availability of the camera. Heater elements can be mounted outside the camera using an external harness assembly using wire management techniques and employing techniques to limit the impact to the styling of the vehicle.

SUMMARY

A lens assembly is provided. The lens assembly includes a lens, a lens barrel, and a heater element. The lens has an inner surface and an outer surface. The lens barrel supports the lens and defines an optical axis, the lens arranged along the optical axis such that the inner surface of the lens is within the lens barrel and the outer surface of the lens is outside the lens barrel. The heater element is in intimate mechanical communication with the inner surface of the lens and has a heater element electrical lead extending radially therefrom to provide power to the heater element.

In addition to one or more of the features described above, or as an alternative, further examples of the lens assembly may include a lens barrel electrical lead extending axially within the lens barrel and a resilient member compressively engaged between the lens the lens barrel. The heater element lead can be arranged radially between the lens barrel electrical lead and the resilient member.

In addition to one or more of the features described above, or as an alternative, further examples of the lens assembly may include that the resilient member is an o-ring, and wherein the heater element extends circumferentially about the optical axis at a location radially inward of the o-ring.

In addition to one or more of the features described above, or as an alternative, further examples of the lens assembly may include that the lens and lens barrel have a unibody arrangement.

In addition to one or more of the features described above, or as an alternative, further examples of the lens assembly may include a lens barrel electrical lead electrically connected to the heater element and extending axially from an end of the lens barrel opposite the lens.

In addition to one or more of the features described above, or as an alternative, further examples of the lens assembly may include that the lens barrel electrical lead includes a compliant pin connector extending axially from the lens.

In addition to one or more of the features described above, or as an alternative, further examples of the lens assembly may include an image sensor printed circuit board with a focal plane array fixed to an end of the lens barrel axially opposite the lens, wherein the compliant pin connector extends through the printed circuit board.

In addition to one or more of the features described above, or as an alternative, further examples of the lens assembly may include that the lens barrel electrical lead has a flexible circuit board connector extending axially from the lens barrel.

In addition to one or more of the features described above, or as an alternative, further examples of the lens assembly may include an image sensor printed circuit board with a focal plane array fixed to an end of the lens barrel axially opposite the lens, wherein the compliant pin connector extends through the printed circuit board.

In addition to one or more of the features described above, or as an alternative, further examples of the lens assembly may include a connector printed circuit board with a zero-insertion force connector axially stacked with the image sensor printed circuit board on a side of image sensor printed circuit board axially oppose the lens, that the image sensor printed circuit board is electrically connected to the connector printed circuit board, and that the flexible printed circuit board connector is connected to the zero-insertion force connector In addition to one or more of the features described above, or as an alternative, further examples of the lens assembly may include that the lens barrel electrical lead has an insert molded contact connector extending axially from the lens barrel.

In addition to one or more of the features described above, or as an alternative, further examples of the lens assembly may include an image sensor printed circuit board with a focal plane array fixed to an end of the lens barrel axially opposite the lens, wherein the insert molded contact connected extends through the image sensor printed circuit board.

In addition to one or more of the features described above, or as an alternative, further examples of the lens assembly may include a spacer fixed to the image sensor printed circuit board on a side of the image sensor printed circuit board axially opposite the lens barrel, a connector printed circuit board fixed to the spacer on a side of the spacer axially opposite the image sensor printed circuit board, and a board coupler electrically connecting the connector printed circuit board with the insert molded contact connector.

In addition to one or more of the features described above, or as an alternative, further examples of the lens assembly may include that the lens barrel electrical lead has a molded interconnect device connector extending axially from the lens barrel.

In addition to one or more of the features described above, or as an alternative, further examples of the lens assembly may include that the cover is formed from an electromagnetic interference-resistant plastic.

In addition to one or more of the features described above, or as an alternative, further examples of the lens assembly may include that the heater element extends circumferentially about the optical axis.

In addition to one or more of the features described above, or as an alternative, further examples of the lens assembly may include an image sensor printed circuit board with a focal plane array fixed to an end of the lens barrel axially opposite the lens, a spacer fixed to the image sensor printed circuit board on a side of the image sensor printed circuit board axially opposite the lens barrel, a connector printed circuit board fixed to the spacer on a side of the spacer axially opposite the image sensor printed circuit board, and a cover fixed to the lens barrel and enclosing the connector printed circuit board, the spacer, and the image sensor printed circuit board.

A lens heating method is also provided. The lens heating method includes, at a lens assembly as described above, receiving electrical power at the heater element electrical lead. Heat is generated with the heater element using the electrical power received by the heater element electrical lead. The heat is communicated to the outer surface of the lens from heater element through the inner surface of the lens. Ice or condensation is removed from the outer surface of the lens with the heat communicated to the outer surface of the lens.

Objects and advantages and a fuller understanding of the invention will be had from the following detailed description and the accompanying drawings.

BRIEF DESCRIPTION OF THE DRAWINGS

For a better understanding, reference may be made to the accompanying drawings. Components in the drawings are not necessarily to scale. Like-referenced numerals and other reference labels designate corresponding parts in the different views.

DETAILED DESCRIPTION

Figure 1:
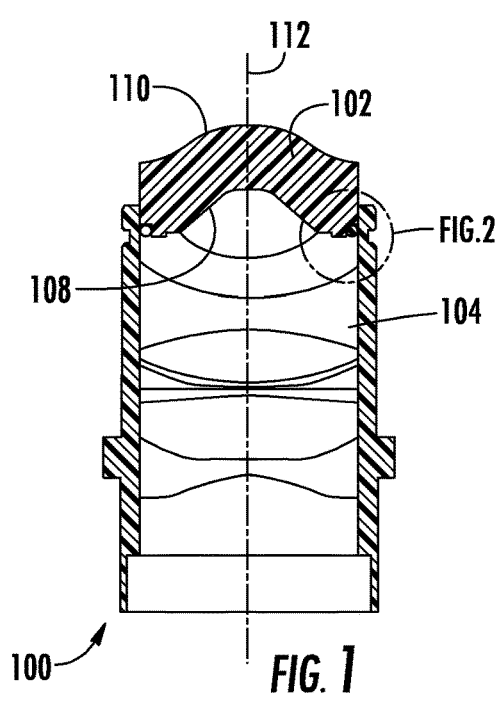
FIGS. 1-5 are cross-sectional and exploded views of a lens assembly constructed in accordance with the present disclosure, showing a heater element.

As previously noted, cameras may employ lens assemblies to provide information about a vehicle and the environment inside and outside the vehicle. The lens assemblies can be arranged at different locations on the vehicle to provide different fields of view of both the interior and the exterior of the vehicle. The different types of information may be used to perform automated operations (e.g., collision avoidance, automated braking) or to provide driver alerts.

Embodiments of the inventive systems and methods detailed herein relate to maintain the field of view provided by the lens assembly. Specifically, heater elements are provided within the lens assembly to remove ice or condensation, e.g., from precipitation, from the exterior of the lens.

FIGS. 1-5 are cross-sectional and exploded views of a lens assembly 100 constructed in accordance with the present disclosure showing a heater element 106. The lens assembly includes a lens 102, a lens barrel 104, and a heater element 106. The lens 102 has an inner surface 108 and an outer surface 110. The lens barrel 104 supports the lens 102 and defines an optical axis 112, the lens 102 arranged along the optical axis 112 such that the inner surface 108 of the lens 102 is within the lens barrel 104 and the outer surface 110 of the lens is outside the lens barrel 104. The heater element 106 is in intimate mechanical communication with the inner surface 108 of the lens 102 and has a heater element electrical lead 114 extending radially therefrom to provide power 10 to the heater element 106 and communicate heat H to the lens 102. In certain examples the heater element 106 is internally mounted, e.g., within the lens assembly 100. In accordance with certain examples the heater element 106 is contained within the lens barrel 104.

Figure 2:
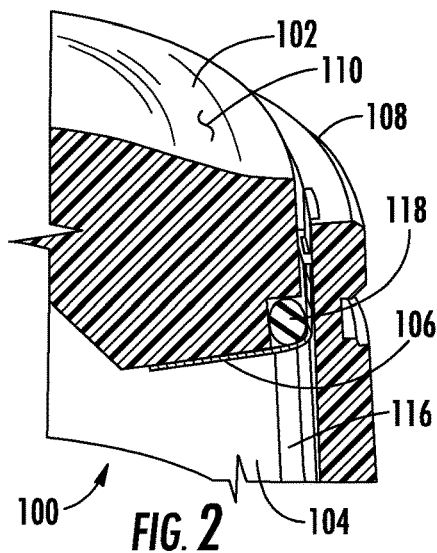
Figure 3:
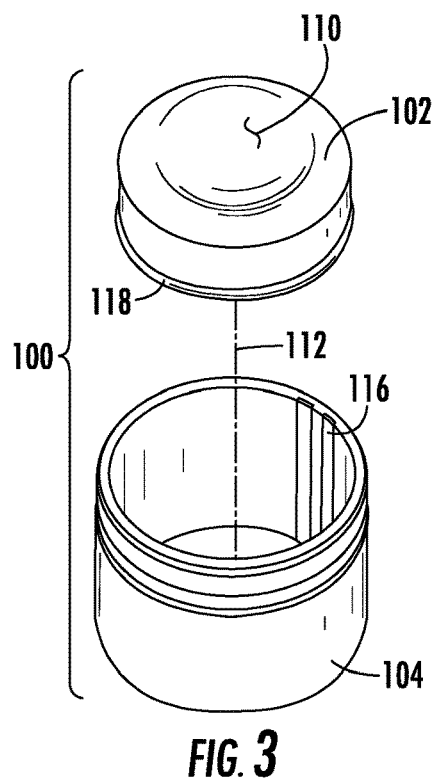
Figure 4:
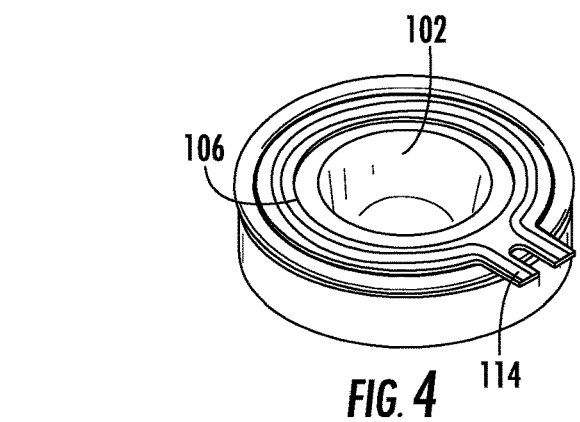
Figure 5:
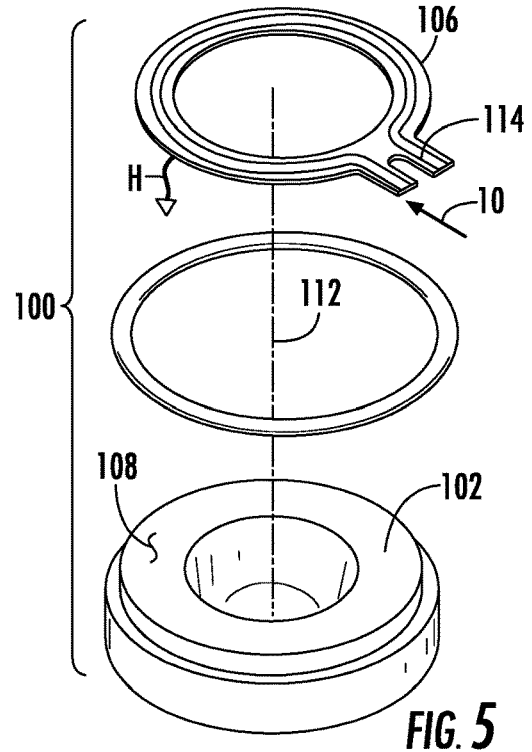
Figure 6:
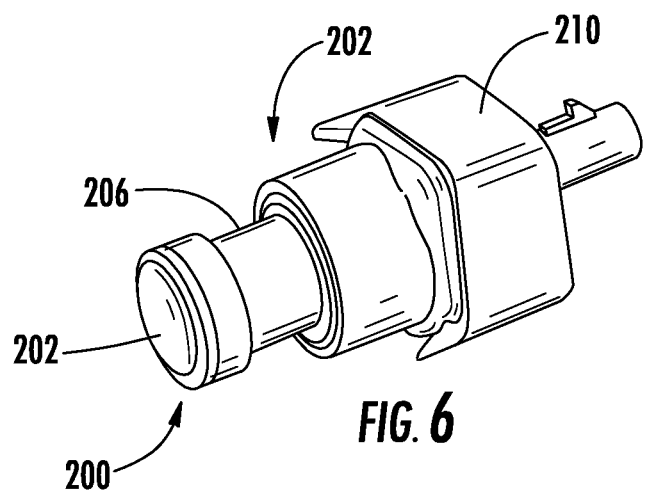
FIGS. 6-9 are perspective, side elevation, and end views of the lens assembly FIG. 1 according to an implementation, showing a unibody arrangement of the lens assembly with a lens, a lens barrel, and a heater element therebetween.
Figure 7:
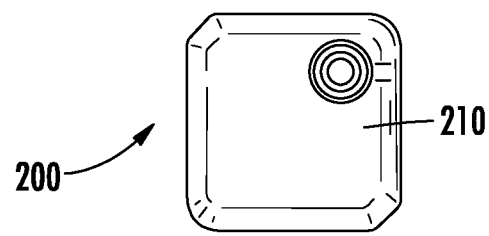
Figure 8:
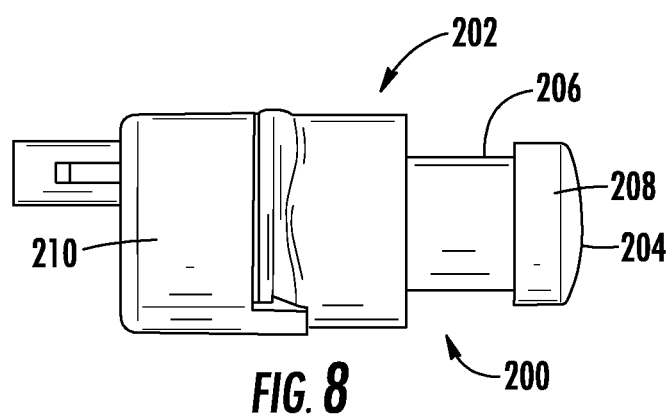
Figure 9:
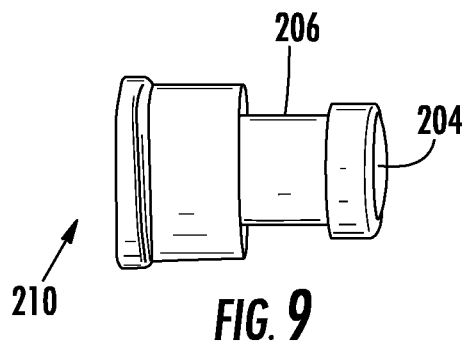

As shown in FIGS. 2 and 3, the lens assembly 100 includes a lens barrel electrical lead 116. The lens barrel electrical lead 116 extends axially within the lens barrel 104. A resilient member 118 is compressively engaged between the lens 102 the lens barrel 104, the heater element 106 arranged radially between the lens barrel electrical lead 116 and the resilient member 118. In certain examples the lens barrel electrical lead 116, e.g., the "harness", is concealed within the lens barrel 104. In accordance with certain examples the resilient member 118 applies pressure to the electrically connect the heater element 106 to the lens barrel electrical lead 116. It is contemplated that, in accordance with certain examples, the resilient member 118 can be an o-ring.

FIGS. 6-9 are perspective, side elevation, and end views of a lens assembly 200. The lens assembly 200 is similar to the lens assembly 100 (shown in FIG. 1) and additionally has a unibody arrangement 202. The unibody arrangement 202 includes a lens 204, a lens barrel 206, a heater element 208 arranged within the lens assembly 200, and a cover 210 fixed to the lens barrel 206.

Figure 10:
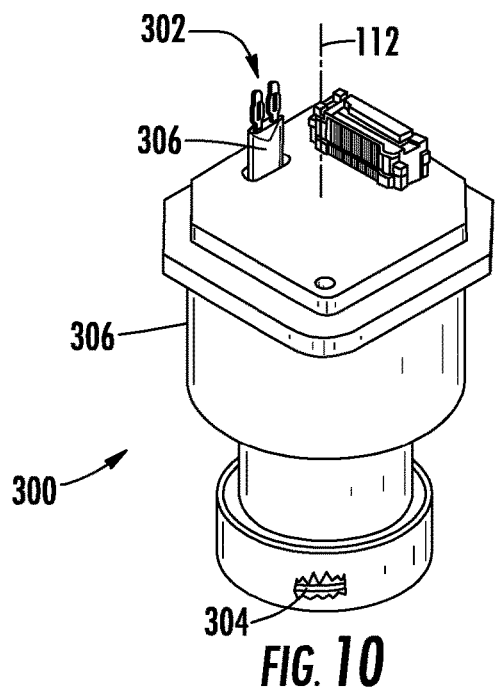
FIGS. 10-12 are perspective and exploded views of the lens assembly of FIG. 1 according to another implementation, showing a compliant pin connector for providing electrical power to a heater element within the lens assembly.
Figure 11:
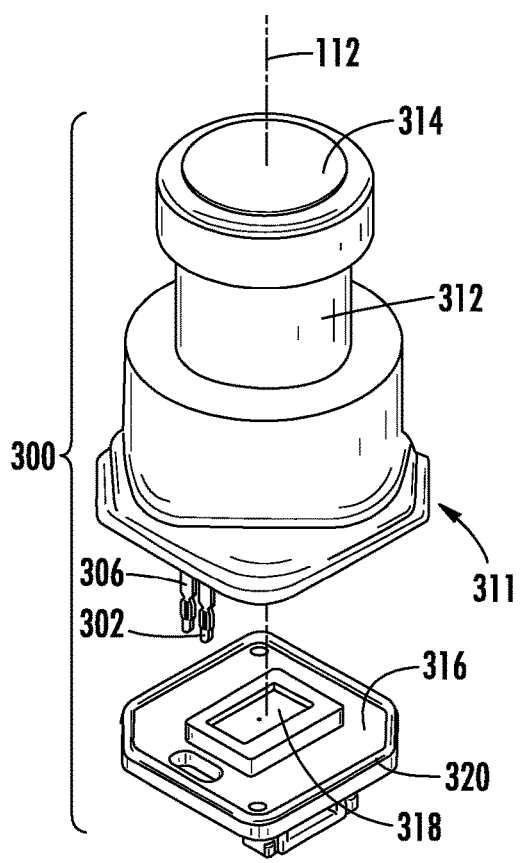
Figure 12:
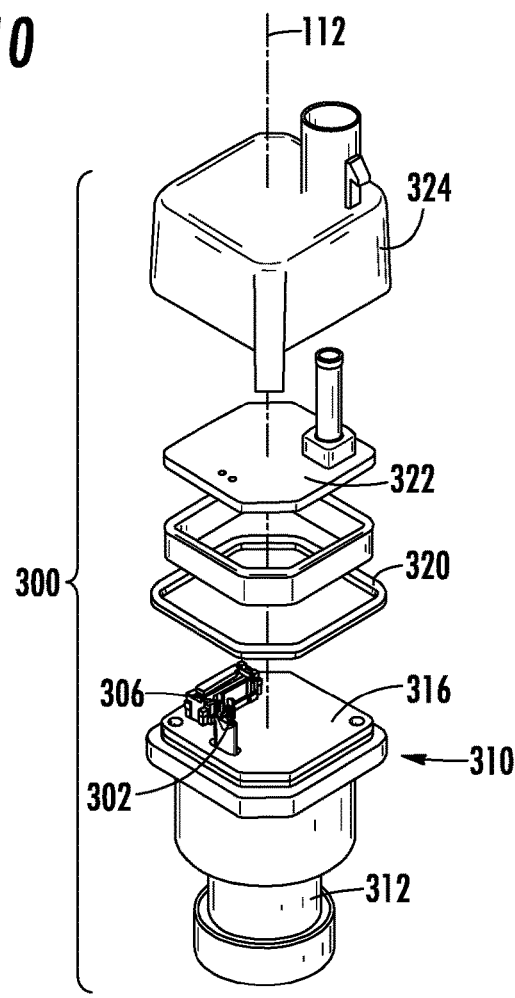
Figure 13:
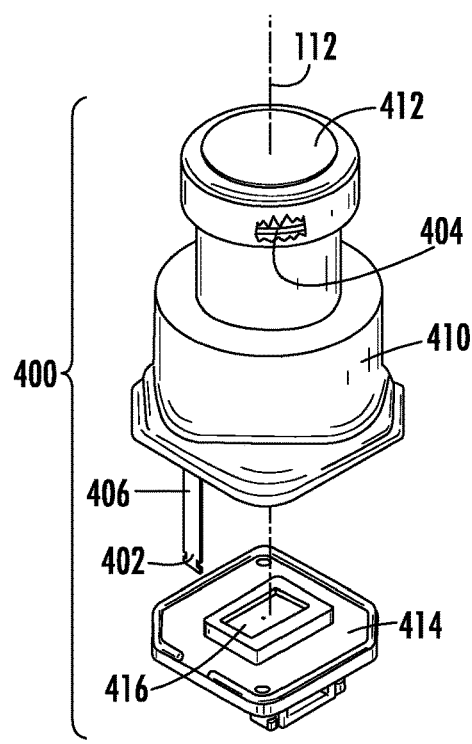
FIGS. 13-16 are perspective and exploded views of the lens assembly of FIG. 1 according to an implementation, showing a flexible circuit board connector to provide electrical power to a heater element within the lens assembly.
Figure 14:
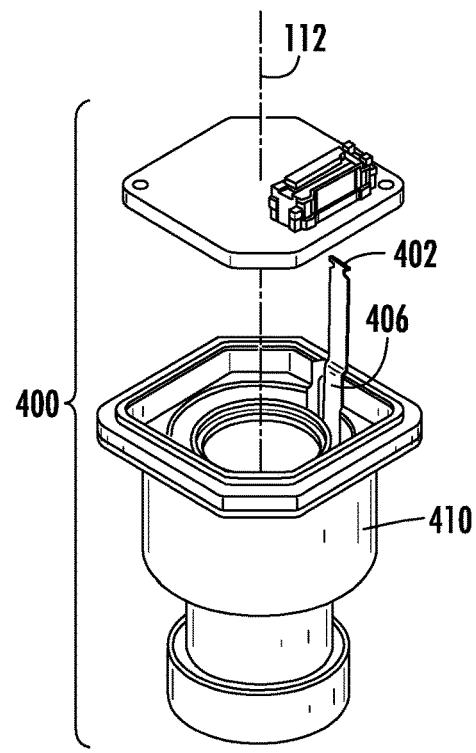

FIGS. 10-12 are perspective and exploded views of a lens assembly 300. The lens assembly 300 is similar to the lens assembly 100 (shown in FIG. 1) and has additionally includes a compliant pin connector 302 for providing the electrical power 10 (shown in FIG. 5) to a heater element 304 within the lens assembly 300. A lens barrel electrical lead 306 is electrically connected to the heater element 304 and extends axially from an end 310 of a lens barrel 312 and opposite a lens 314 of the lens assembly 300. The compliant pin connector 302 extends axially from the lens assembly 300.

As shown in FIG. 12, the lens assembly 300 includes an image sensor printed circuit board 316 with a focal plane array 318 (shown in FIG. 11) fixed to the end 310 of the lens barrel 312 axially opposite the lens 314. A spacer with an integrated silicone seal 320 is fixed to the image sensor printed circuit board 316 on a side of the image sensor printed circuit board 316 axially opposite the lens barrel 312. A connector printed circuit board 322 is fixed to the spacer with an integrated silicone seal 320 on a side of the spacer with an integrated silicone seal 320 axially opposite the image sensor printed circuit board 316. A cover 324, e.g., an electromagnetic interference-resistant plastic cover, is fixed to the lens barrel 312 and encloses the connector printed circuit board 322, the spacer with an integrated silicone seal 320, and the image sensor printed circuit board 316. An adhesive can be arranged between image sensor printed circuit board 316 and the lens barrel 312.

FIGS. 13-16 are perspective and exploded views of a lens assembly 400. The lens assembly 400 is similar to the lens assembly 100 (shown in FIG. 1) and additionally includes a flexible circuit board connector 402 for providing the electrical power 10 (shown in FIG. 5) to a heater element 404 within the lens assembly 400. A lens barrel electrical lead 406 is electrically connected to the heater element 404 and extends axially from an end 408 of a lens barrel 410 opposite a lens 412 of the lens assembly 400. The flexible circuit board connector 402 extends axially from the lens barrel 410 and cooperates with a zero-insertion force connector 428 to provide power to the heater element 404. In certain embodiments the flexible circuit board connector 402 allows the resilient member to be omitted from the lens assembly 400.

Figure 15:
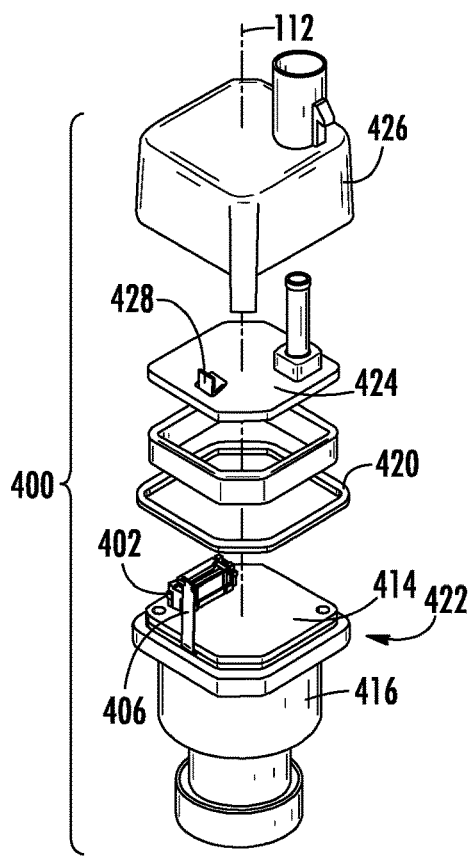
Figure 16:
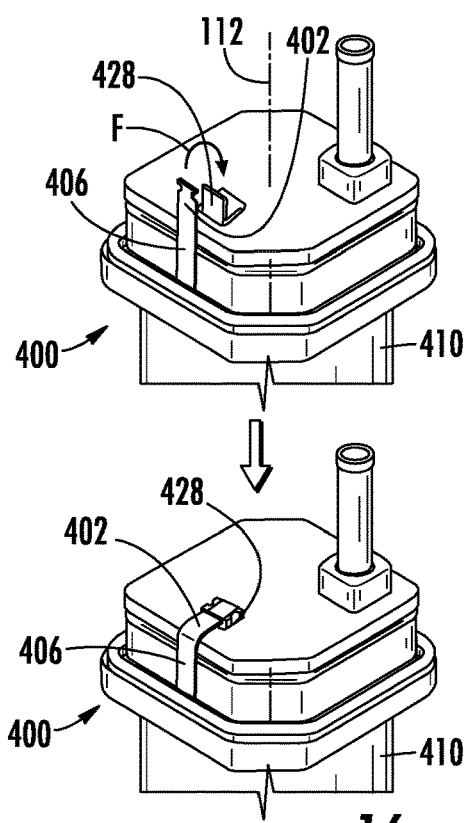
Figure 17:
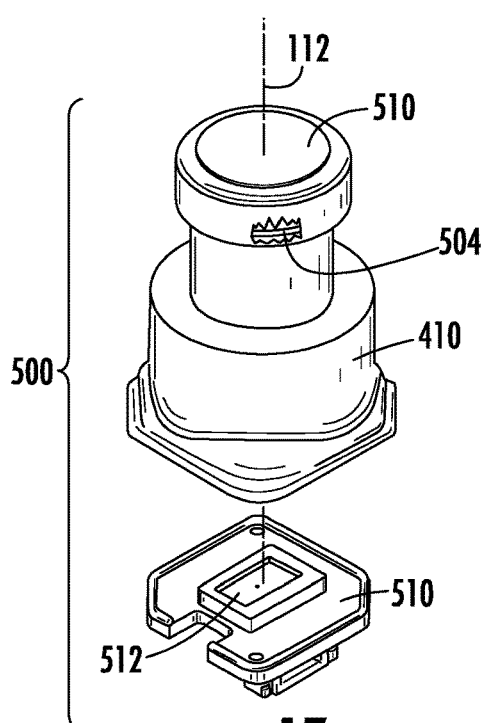
FIGS. 17-21 are perspective and exploded views of the lens assembly of FIG. 1 according to a further implementation, showing a molded interconnect device connector to provide electrical power to a heater element within the lens assembly.
Figure 18:
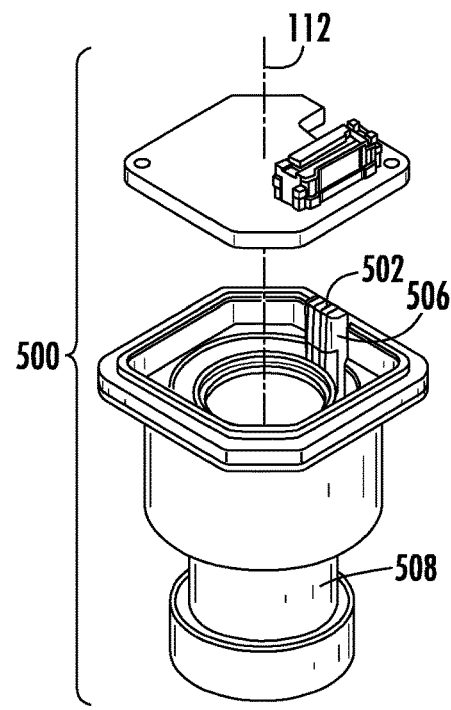

As shown in FIG. 15, the lens assembly 400 includes an image sensor printed circuit board 414 with a focal plane array 416 (shown in FIG. 13) fixed to an end 418 of the lens barrel 410 axially opposite the lens 412. A spacer with an integrated silicone seal 420 is fixed to the image sensor printed circuit board 414 on a side 422 of the image sensor printed circuit board 414 axially opposite the lens barrel 410. A connector printed circuit board 424 seating a zero-insertion force connector 428 is fixed to the spacer with an integrated silicone seal 420 on a side of the spacer with an integrated silicone seal 420 axially opposite the image sensor printed circuit board 414. The flexible printed circuit board 402 extends axially through (or around) the image sensor printed circuit board 414, axially overlaps the image sensor printed circuit board 414 and the connector printed circuit board 424 and is electrically connected to the connector printed circuit board 424 by the zero-insertion force connector 428. A cover 426, e.g., an electromagnetic interference-resistant plastic cover, is fixed to the lens barrel 410 and encloses the connector printed circuit board 424, the spacer with an integrated silicone seal 420, and the image sensor printed circuit board 414. An adhesive can be arranged between image sensor printed circuit board 414 and the lens barrel 410.

FIGS. 17-21 are perspective and exploded views of a lens assembly 500. The lens assembly 500 is similar to the lens assembly 100 (shown in FIG. 1) and additionally includes a molded interconnect device connector 502 for providing the electrical power 10 (shown in FIG. 5) to a heater element 504 within the lens assembly 500. A lens barrel electrical lead 506 is electrically connected to the heater element 504 and extends axially from an end 514 of a lens barrel 508 opposite a lens 524 of the lens assembly 500. The lens barrel electrical lead 506 includes the molded interconnect device connector 502 and extends axially from the lens barrel 508.

Figure 19:
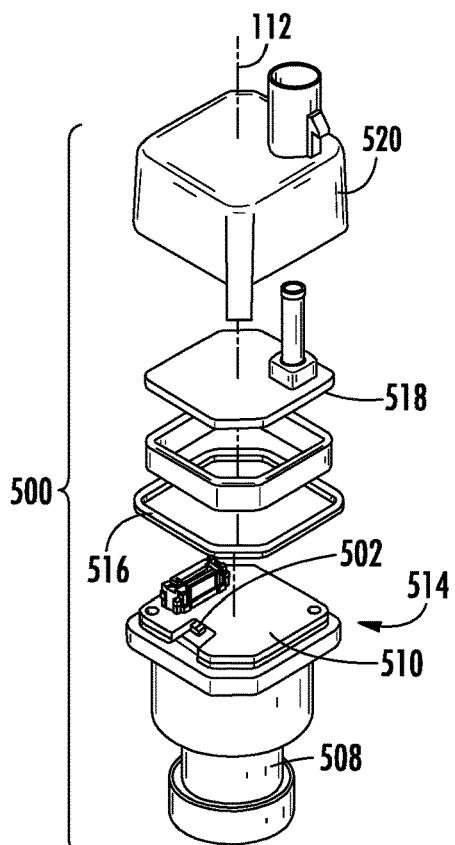
Figure 20:
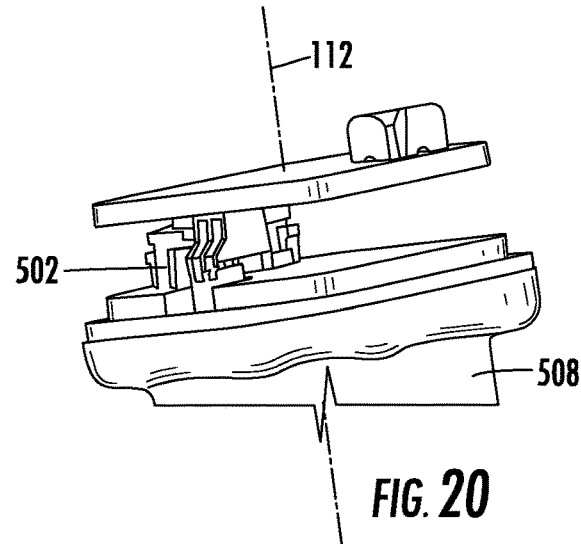
Figure 21:
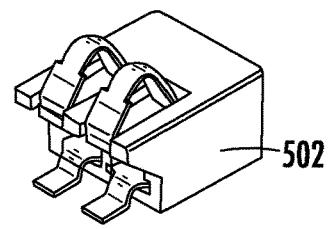

As shown in FIG. 19, the lens assembly 500 includes an image sensor printed circuit board 510 with a focal plane array 512 (shown in FIG. 17) fixed to an end 514 of the lens barrel 508 axially opposite the lens 524. A spacer with an integrated silicone seal 516 is fixed to the image sensor printed circuit board 510 on a side of the image sensor printed circuit board 510 axially opposite the lens barrel 508. A connector printed circuit board 518 is fixed to the spacer with an integrated silicone seal 516 on a side of the spacer with an integrated silicone seal 516 axially opposite the image sensor printed circuit board 510. A cover 520, e.g., an electromagnetic interference-resistant plastic cover, is fixed to the lens barrel 508 and encloses the connector printed circuit board 518, the spacer with an integrated silicone seal 516, and the image sensor printed circuit board 510. A board coupler 522 (shown in FIG. 21) is arranged axially between the image sensor printed circuit board 510 and connector printed circuit board 518 to provide electrical communication between the connector printed circuit board 518 and the heater element 504 (shown in FIG. 17). An adhesive can be arranged between image sensor printed circuit board 510 and the lens barrel 508.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:
1. A lens assembly, comprising:
a lens having an inner surface and an outer surface;
a lens barrel supporting the lens and defining an optical axis, the lens arranged along the optical axis such that the inner surface of the lens is within the lens barrel and the outer surface of the lens is outside the lens barrel;
a lens barrel electrical lead extending axially within the lens barrel;
a resilient member compressively engaged between the lens and the lens barrel; and
a heater element in intimate mechanical communication with the inner surface of the lens, a portion of the heater element arranged between the lens barrel electrical lead and the resilient member, wherein the heater element has a heater element electrical lead extending radially therefrom to provide power to the heater element, and the resilient member is configured to apply a pressure to the heater element to electrically connect the heater element to the lens barrel electrical lead.

2. The lens assembly of claim 1, wherein the resilient member is an o-ring, and wherein the heater element extends circumferentially about the optical axis at a location radially inward of the o-ring.

3. The lens assembly of claim 1, wherein the lens and the lens barrel have a unibody arrangement including the heater element.

4. The lens assembly of claim 1, further comprising a lens barrel electrical lead electrically connected to the heater element and extending axially from an end of the lens barrel opposite the lens.

5. The lens assembly of claim 4, wherein the lens barrel electrical lead includes a compliant pin connector extending axially from the lens barrel.

6. The lens assembly of claim 5, further comprising an image sensor printed circuit board with a focal plane array fixed to an end of the lens barrel axially opposite the lens, wherein the compliant pin connector extends through the printed circuit board.

7. The lens assembly of claim 5, wherein the lens barrel electrical lead includes an insert molded contact connector extending axially from the lens barrel.

8. The lens assembly of claim 7, further comprising an image sensor printed circuit board with a focal plane array fixed to an end of the lens barrel axially opposite the lens, wherein the insert molded contact connected extends through the image sensor printed circuit board.

9. The lens assembly of claim 8, further comprising: a spacer fixed to the image sensor printed circuit board on a side of the image sensor printed circuit board axially opposite the lens barrel; a connector printed circuit board fixed to the spacer on a side of the spacer axially opposite the image sensor printed circuit board;

and a board coupler electrically connecting the connector printed circuit board with the insert molded contact connector.

10. The lens assembly of claim 4, wherein the lens barrel electrical lead includes a flexible printed circuit board connector extending axially from the lens barrel.

11. The lens assembly of claim 10, further comprising an image sensor printed circuit board with a focal plane array fixed to an end of the lens barrel axially opposite the lens, wherein the flexible printed circuit board connector is laterally offset from the image sensor printed circuit board and axially overlaps the image sensor printed sensor board.

12. The lens assembly of claim 11, further comprising a connector printed circuit board with a zero-insertion force connector axially stacked with the image sensor printed circuit board on a side of image sensor printed circuit board axially oppose the lens, wherein the image sensor printed circuit board is electrically connected to the connector printed circuit board, wherein the flexible printed circuit board connector is connected to the zero-insertion force connector.

13. The lens assembly of claim 1, further comprising:
an image sensor printed circuit board with a focal plane array fixed to an end of the lens barrel axially opposite the lens;
a spacer fixed to the image sensor printed circuit board on a side of the image sensor printed circuit board axially opposite the lens barrel;
a connector printed circuit board fixed to the spacer on a side of the spacer axially opposite the image sensor printed circuit board; and
a cover fixed to the lens barrel and enclosing the connector printed circuit board, the spacer, and the image sensor printed circuit board.

14. The lens assembly of claim 13, wherein the cover is formed from an electromagnetic interference-resistant plastic.

15. The lens assembly of claim 1, wherein the heater element extends circumferentially about the optical axis.

16. A lens heating method, comprising:
at a lens assembly includes a lens having an inner surface and an outer surface; a lens barrel supporting the lens and defining an optical axis, the lens arranged along the optical axis such that the inner surface of the lens is within the lens barrel and the outer surface of the lens is outside the lens barrel; a lens barrel electrical lead extending axially within the lens barrel; a resilient member compressively engaged between the lens and the lens barrel; and a heater element in intimate mechanical communication with the inner surface of the lens, a portion of the heater element arranged between the lens barrel electrical lead and the resilient member, wherein the heater element has a heater element electrical lead extending radially therefrom,
applying a pressure by the resilient member to the heater to electrically connect the heater element to the lens barrel electrical lead;
receiving electrical power at the heater element electrical lead;
generating heat with the heater element using the electrical power;
communicating the heat to the outer surface of the lens from heater element through the inner surface of the lens; and
removing ice or condensation from the outer surface of the lens with the heat communicated to the outer surface of the lens.

* * * * *